United States Patent
Chen et al.

(10) Patent No.: US 10,580,487 B2
(45) Date of Patent: Mar. 3, 2020

(54) THREE DIMENSIONAL NOR FLASH MEMORY WITH ISOLATED SOURCE LINES AND METHOD OF OPERATING THE SAME

(71) Applicant: Winbond Electronics Corp., Taichung (TW)

(72) Inventors: Chiang-Hung Chen, Taichung (TW); Yao-Ting Tsai, Taichung (TW); Wen Hung, Taichung (TW); Yu-Kai Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/048,364

(22) Filed: Jul. 30, 2018

(65) Prior Publication Data

US 2019/0043569 A1    Feb. 7, 2019

(30) Foreign Application Priority Data

Aug. 1, 2017    (CN) .......................... 2017 1 0645400

(51) Int. Cl.
   G11C 11/56      (2006.01)
   H01L 21/3215    (2006.01)
   (Continued)

(52) U.S. Cl.
   CPC ...... G11C 11/5671 (2013.01); G11C 16/0466 (2013.01); G11C 16/0483 (2013.01);
   (Continued)

(58) Field of Classification Search
   CPC ............ G11C 11/5671; G11C 16/0466; G11C 16/0483; G11C 16/26; G11C 16/14;
   (Continued)

(56) References Cited

U.S. PATENT DOCUMENTS

| 9,087,975 B2 | 7/2015 | Wang et al. |
| 9,679,849 B1* | 6/2017 | Chen .................. G11C 16/0483 |

(Continued)

FOREIGN PATENT DOCUMENTS

| JP | 2010251572 | 11/2010 |
| TW | I555132 | 10/2016 |

OTHER PUBLICATIONS

Masaru Yano, et al., "NOR Flash Memory and Manufacturing Method Thereof," Unpublished U.S. Appl. No. 15/892,350, filed Feb. 8, 2018.

*Primary Examiner* — Jerome Leboeuf
(74) *Attorney, Agent, or Firm* — JCIPRNET

(57) ABSTRACT

A three dimensional memory includes a substrate, a plurality of source lines, a plurality of isolation structures, a plurality of drain lines, a plurality of bit lines, a plurality of charge storage structures, and a plurality of conductive layers. The source lines are located on the substrate. The isolation structures are respectively located between the source lines, so as to electrically isolate the source lines from each other. The drain lines are located on the source lines. Extending directions of the source lines and the drain lines are different. The bit lines extend from the source lines to the drain lines. The charge storage structures respectively surround the bit lines. The conductive layers respectively cover surfaces of the charge storage structures arranged along each of the source lines.

12 Claims, 17 Drawing Sheets

(51) Int. Cl.

| | | |
|---|---|---|
| *H01L 23/532* | (2006.01) | |
| *H01L 29/51* | (2006.01) | |
| *G11C 16/10* | (2006.01) | |
| *G11C 16/14* | (2006.01) | |
| *G11C 16/26* | (2006.01) | |
| *H01L 27/11582* | (2017.01) | |
| *G11C 16/04* | (2006.01) | |
| *H01L 21/762* | (2006.01) | |
| *H01L 21/3105* | (2006.01) | |
| *H01L 21/768* | (2006.01) | |
| *H01L 21/02* | (2006.01) | |
| *H01L 21/311* | (2006.01) | |
| *H01L 21/3213* | (2006.01) | |
| *H01L 23/528* | (2006.01) | |
| *H01L 21/28* | (2006.01) | |
| *H01L 29/423* | (2006.01) | |
| *H01L 27/11521* | (2017.01) | |
| *H01L 29/66* | (2006.01) | |
| *H01L 29/788* | (2006.01) | |

(52) U.S. Cl.
CPC .............. *G11C 16/10* (2013.01); *G11C 16/14* (2013.01); *G11C 16/26* (2013.01); *H01L 21/0217* (2013.01); *H01L 21/02164* (2013.01); *H01L 21/02271* (2013.01); *H01L 21/31053* (2013.01); *H01L 21/31111* (2013.01); *H01L 21/31116* (2013.01); *H01L 21/32135* (2013.01); *H01L 21/32155* (2013.01); *H01L 21/7684* (2013.01); *H01L 21/76224* (2013.01); *H01L 21/76283* (2013.01); *H01L 21/76877* (2013.01); *H01L 23/528* (2013.01); *H01L 23/53271* (2013.01); *H01L 27/11521* (2013.01); *H01L 27/11582* (2013.01); *H01L 29/40117* (2019.08); *H01L 29/42324* (2013.01); *H01L 29/517* (2013.01); *H01L 29/518* (2013.01); *H01L 29/66825* (2013.01); *H01L 29/7881* (2013.01); *H01L 29/7889* (2013.01)

(58) Field of Classification Search
CPC .............. G11C 16/10; H01L 21/76283; H01L 29/42324; H01L 27/11521; H01L 29/7889; H01L 29/7881; H01L 29/66825; H01L 21/28282; H01L 21/31116; H01L 21/02271; H01L 21/0217; H01L 21/32135; H01L 21/31111; H01L 21/02164; H01L 21/31053; H01L 21/76224; H01L 27/11582; H01L 23/53271; H01L 21/32155; H01L 21/7684; H01L 21/76877; H01L 29/517; H01L 29/518; H01L 23/528
See application file for complete search history.

(56) References Cited

U.S. PATENT DOCUMENTS

| | | | | |
|---|---|---|---|---|
| 2009/0212350 | A1* | 8/2009 | Kidoh | H01L 27/0688 257/324 |
| 2010/0038703 | A1* | 2/2010 | Fukuzumi | G11C 5/02 257/326 |
| 2015/0364488 | A1* | 12/2015 | Pachamuthu | H01L 29/665 257/314 |
| 2016/0086970 | A1* | 3/2016 | Peng | H01L 27/11565 257/324 |
| 2017/0053906 | A1* | 2/2017 | Or-Bach | H01L 27/11548 |
| 2017/0092371 | A1* | 3/2017 | Harari | G11C 16/3431 |

* cited by examiner

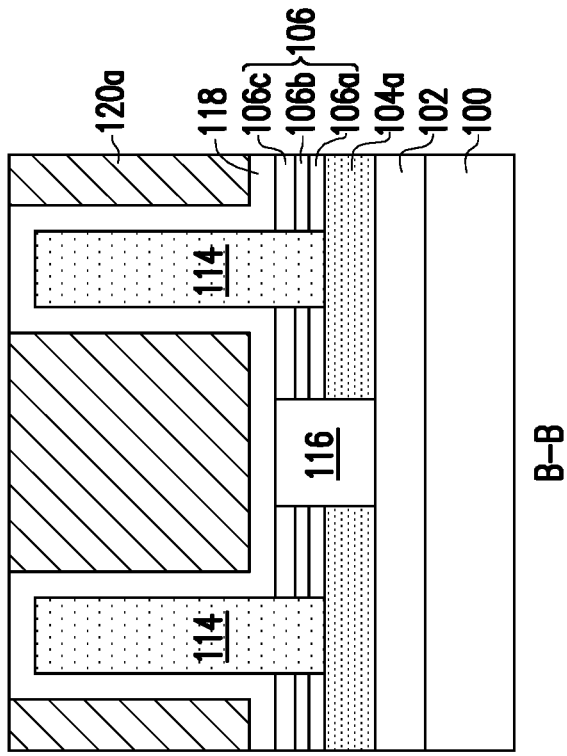
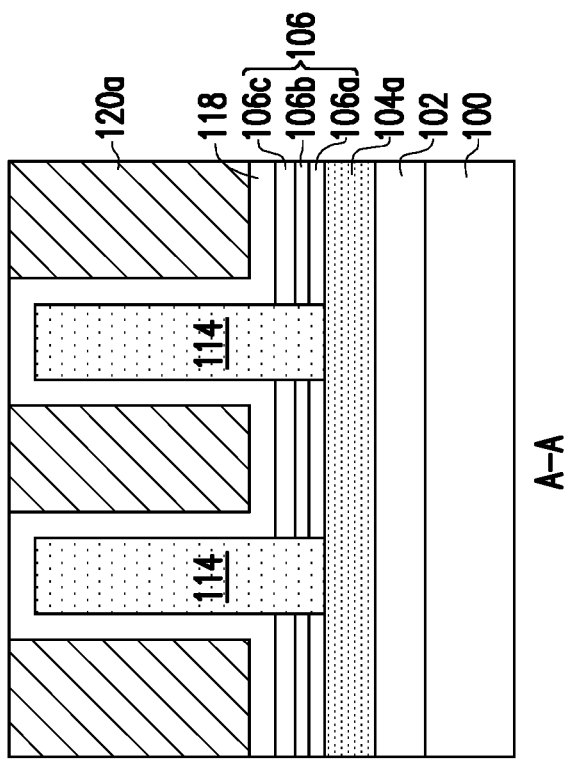

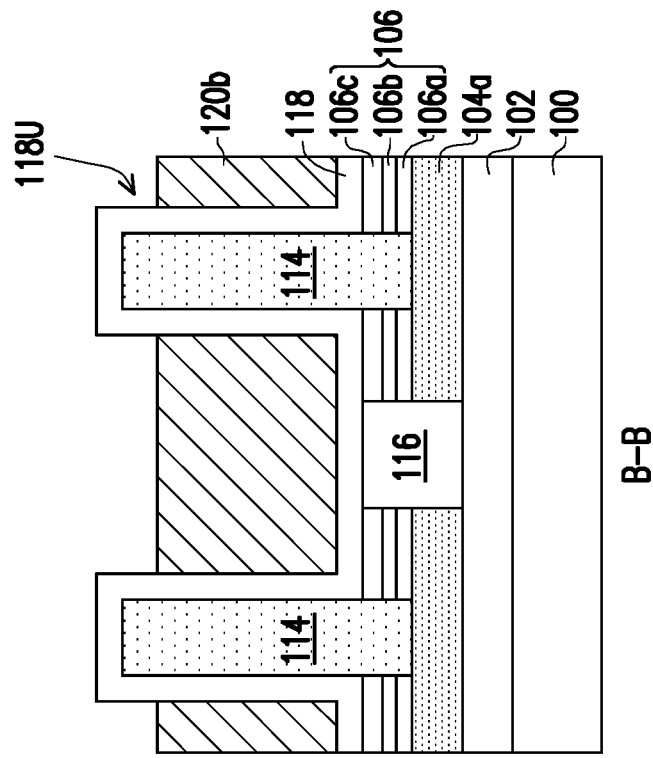
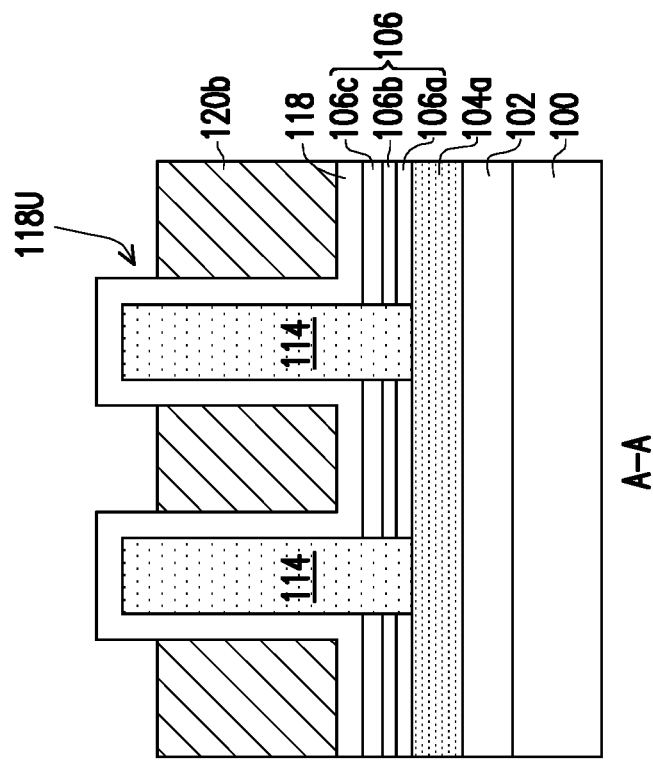

THREE DIMENSIONAL NOR FLASH MEMORY WITH ISOLATED SOURCE LINES AND METHOD OF OPERATING THE SAME

CROSS-REFERENCE TO RELATED APPLICATION

This application claims the priority benefit of China application serial no. 201710645400.1, filed on Aug. 1, 2017. The entirety of the above-mentioned patent application is hereby incorporated by reference herein and made a part of this specification.

TECHNICAL FIELD

The invention is related to a semiconductor device and a method of operating the same, and particularly to a three dimensional memory and a method of operating the same.

DESCRIPTION OF RELATED ART

A flash memory can be used to perform data writing, reading, and erasing operations repeatedly for many times, and the data stored in the flash memory will not disappear after the power is turned off. Therefore, the flash memory has become a non-volatile memory device widely used in personal computers and various electronic devices.

In a conventional flash memory, a floating gate and a control gate are fabricated with doped polysilicon and spaced by a dielectric layer. The floating gate and the substrate are spaced by a tunneling oxide layer. When the data in the flash memory is read, a working voltage is applied to the control gate, and the channel under the floating gate is turned on/off according to a charged state of the floating gate, and the ON/OFF state of the channel is used to determine whether the data is "0" or "1".

In line with progress in semiconductor technology, various electronic products are developed with high speed, high performance and slim size. Accordingly, the demand for flash memory with higher storage capability also increases. Therefore, the design of flash memories has also been developed to fabricate a three-dimensional flash memory structure with high integration and high density.

SUMMARY OF INVENTION

The invention provides a three dimensional memory and a method of operating the same, which can store a data of four bits in a single memory cell, thereby improving the storage capability of the overall three dimensional memory.

The invention provides a three dimensional memory, in which an isolation structure is disposed between adjacent source lines so as to reduce interference during reading operation.

The invention provides a three dimensional memory including a substrate, a plurality of source lines, a plurality of isolation structures, a plurality of drain lines, a plurality of bit lines, a plurality of charge storage structures and a plurality of conductive layers. The source lines are located on the substrate. The isolation structures are respectively located between the source lines so as to electrically isolate the source lines from each other. The drain lines are located on the source lines. Extending directions of the source lines and the drain lines are different. The bit lines extend from the source lines to the drain lines. The charge storage structures respectively surround the bit lines. The conductive layers respectively cover surfaces of the charge storage structures arranged along each of the source lines.

In summary, according to the invention, the isolation structure is disposed between two adjacent source lines so as to electrically isolate the two adjacent source lines, thereby reducing interference during reading operation. In addition, the invention utilizes a high dielectric constant material as a charge storage layer which can store a data of four bits in a single memory cell, thereby improving the storage capability of the overall three dimensional memory. Moreover, the invention erases the memory cell via a band to band hot hole injection mode which can reduce damage caused to the tunneling dielectric layer and thus improving the reliability of the three dimensional memory.

In order to make the aforementioned features and advantages of the invention more comprehensible, embodiments accompanying figures are described in detail below.

BRIEF DESCRIPTION OF THE DRAWINGS

FIG. 2A to FIG. 2L are cross-sectional schematic views illustrating a fabricating process along line A-A in FIG. 1.

DESCRIPTION OF EMBODIMENTS

Figure 1:
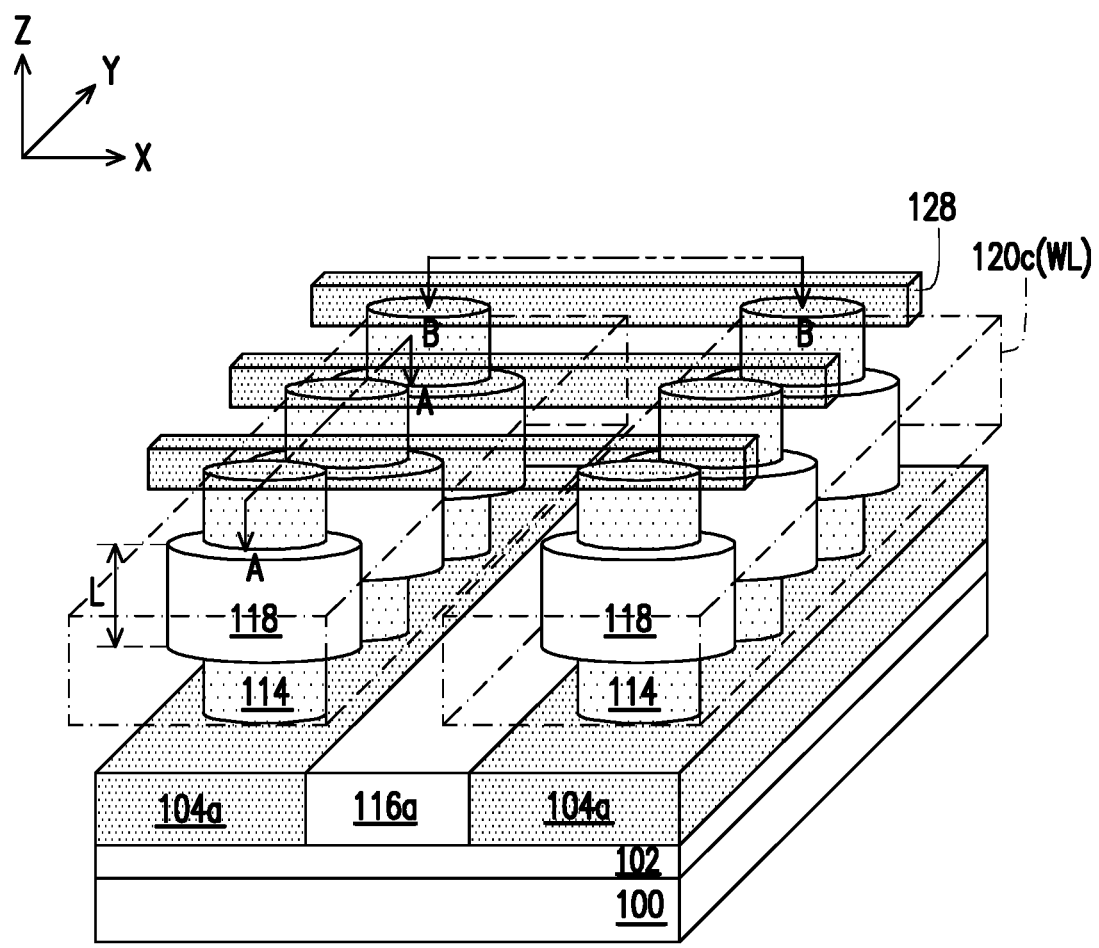
FIG. 1 is a three dimensional schematic view illustrating a three dimensional memory according to an embodiment of the invention.

The disclosure is illustrated more comprehensively referring to the drawings of the embodiments. However, the disclosure may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

FIG. 1 is a three dimensional schematic view illustrating a three dimensional memory according to an embodiment of the invention. In the embodiment, the three dimensional memory in FIG. 1 may be, for example, an NOR flash memory. For clarity of illustration, FIG. 1 only illustrates a substrate, a bottom dielectric layer, a source line, an isolation structure, a memory cell and a drain line; please refer to the other cross-sectional schematic views for illustration of the rest of components.

Referring to FIG. 1, the embodiment provides a three dimensional memory including a substrate 100, a bottom dielectric layer 102, a plurality of source lines 104a, a plurality of isolation structures 116a, a plurality of memory cells, a plurality of bit lines 114, a plurality of word lines WL and a plurality of drain lines 128. Specifically, the bottom dielectric layer 102 is disposed on the substrate 100. The source lines 104a are disposed on the bottom dielectric layer 102 so that the bottom dielectric layer 102 is located between the source lines 104a and the substrate 100. The source lines 104a are strip-like patterns which extend along a Y-direction. The isolation structures 116a are disposed on the bottom dielectric layer 102 between the source lines 104a to electrically isolate two adjacent source lines 104a, thereby reducing the interference during reading operation. In an embodiment, the isolation structures 116a are strip-shaped and extend along the Y-direction.

The memory cells are respectively located on the source lines 104a in array. Specifically, each memory cell includes a charge storage structure 118. The charge storage structure 118 surrounds a second portion 114b (as shown in FIG. 2L) of the bit line 114. In an embodiment, the bit line 114 may be, for example, a cylindrical structure, and the charge storage structure 118 is band-shaped and surrounds a central portion of the bit line 114, which should not be construed as a limitation to the invention. In other embodiments, the bit line 114 may be, for example, a polygonal pillar structure. In addition, a length L of the charge storage structure 118 relative to a vertical direction of a surface of the substrate 100 may be regarded as a channel length. The bit line 114 extends from the source line 104a to the drain line 128. In an embodiment, the bit line 114 extends along a Z-direction so that both ends of the bit line 114 are respectively connected with the source line 104a and the drain line 128. The material for forming the bit line 114 includes a p-type polysilicon material, such that a first portion 114a (see FIG. 2L) of the bit line 114 between the source lines 104a and the charge storage structure 118 may serve as a source. The second portion 114b of the bit line 114 covered by the charge storage structure 118 may serve as an active region or a channel region. A third portion 114c (as shown in FIG. 2L) of the bit line 114 between the drain line 128 and charge storage structure 118 may serve as a drain. Each word line WL covers surfaces of the plurality of charge storage structures 118 arranged along the same column. A shown in FIG. 1, the word line WL extends along the Y-direction. That is to say, an extending direction of the word line WL and an extending direction of the source line 104a are the same.

Each drain line 128 is connected with a plurality of bit lines 114 arranged in the same row. The drain line 128 extends along an X-direction. In other words, an extending direction of the drain line 128 and an extending direction of the source line 104a are different.

FIG. 2A to FIG. 2L are cross-sectional schematic views illustrating a fabricating process along line A-A in FIG. 1. FIG. 3A to FIG. 3P are cross-sectional schematic views illustrating a fabricating process along line B-B in FIG. 1.

Figure 2A:
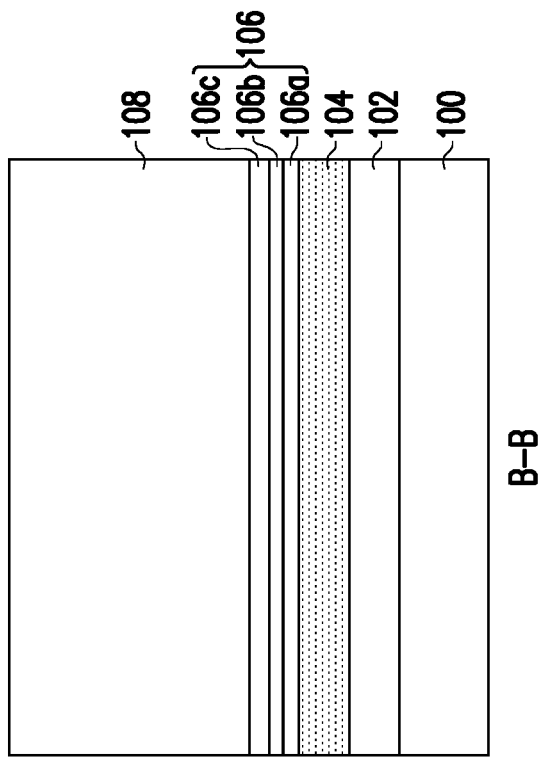
Figure 3A:
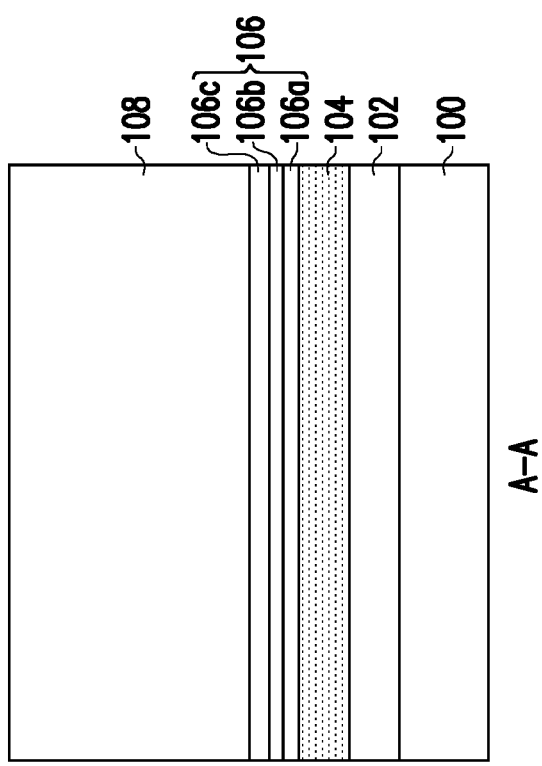
FIG. 3A to FIG. 3P are cross-sectional schematic views illustrating a fabricating process along line B-B in FIG. 1.

Referring to FIG. 2A and FIG. 3A, the embodiment provides a fabricating method of a three dimensional memory in FIG. 1; the fabricating steps are described as follows. First of all, a substrate 100 is provided. In an embodiment, the substrate 100 may be, for example, a semiconductor substrate, a semiconductor compound substrate or a semiconductor over insulator (SOI). In the embodiment, the substrate 100 may be a p-type silicon substrate.

Next, the bottom dielectric layer 102, a conductive layer 104, a buffer structure 106 and a dielectric layer 108 are formed on the substrate 100 in order. In an embodiment, the bottom dielectric layer 102 may be a silicon oxide layer, which may be formed via a chemical vapor deposition process. The conductive layer 104 may be a doped polysilicon layer. In the embodiment, the conductive layer 104 may be an n+polysilicon layer, and a dopant implanted therein may be phosphor or arsenic, and the doping concentration may be, for example, $1 \times 10^{18}/cm^3$ to $1 \times 10^{21}/cm^3$. The buffer structure 106 includes a composite structure consisting of a silicon oxide layer 106a, a silicon nitride layer 106b and a silicon oxide layer 106c, which may be formed via a chemical vapor deposition process. The dielectric layer 108 may be a silicon nitride layer, which may be formed via a chemical vapor disposition process.

Figure 3B:
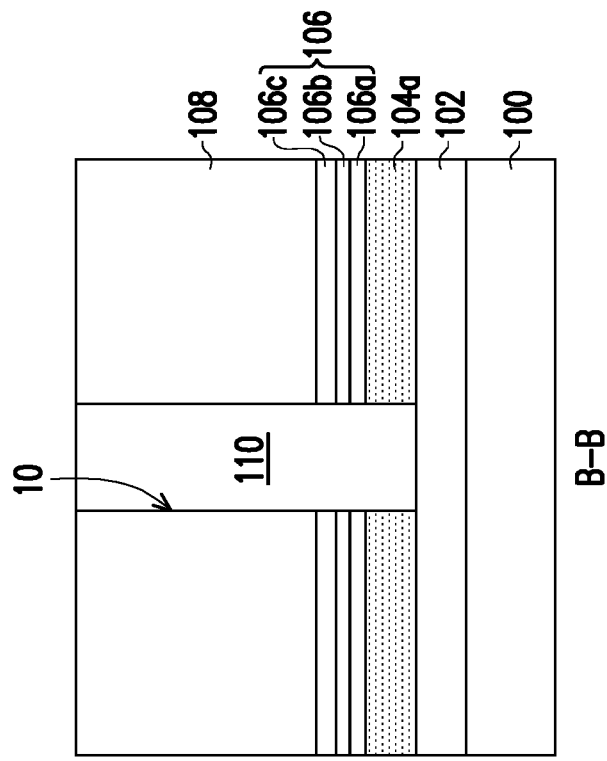
Figure 2B:
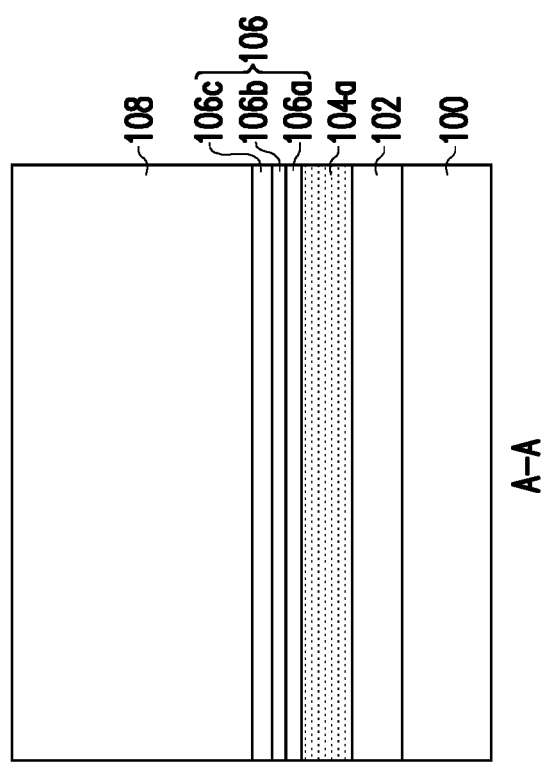
Figure 3C:
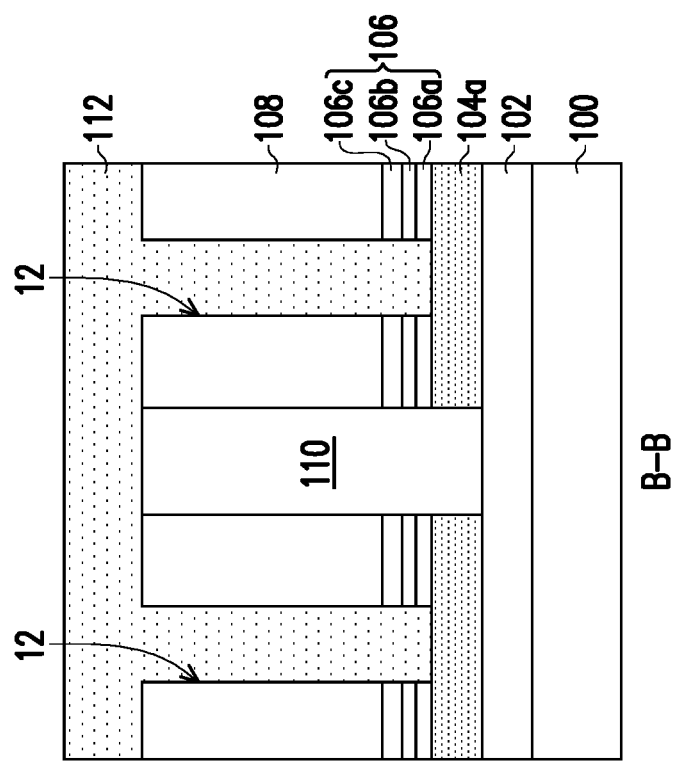
Figure 2C:
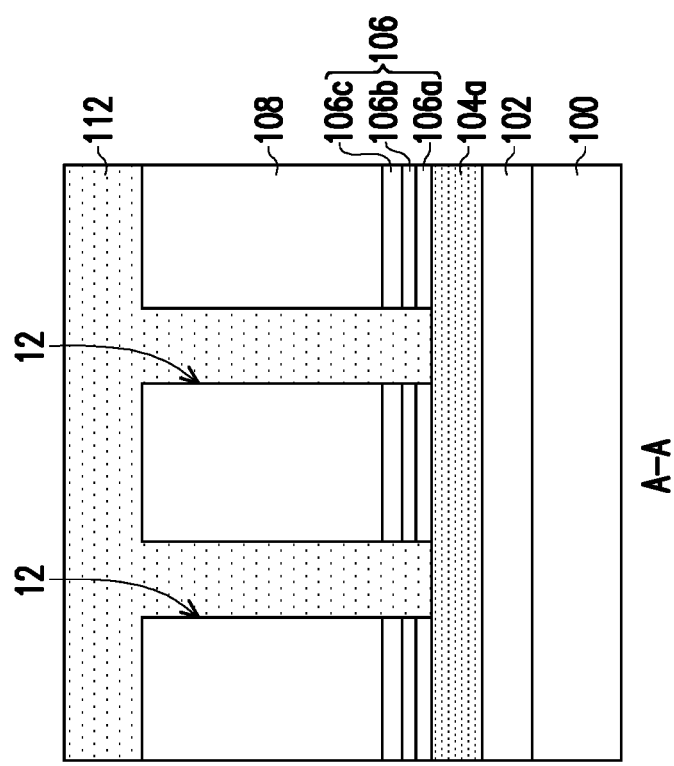
Figure 3D:
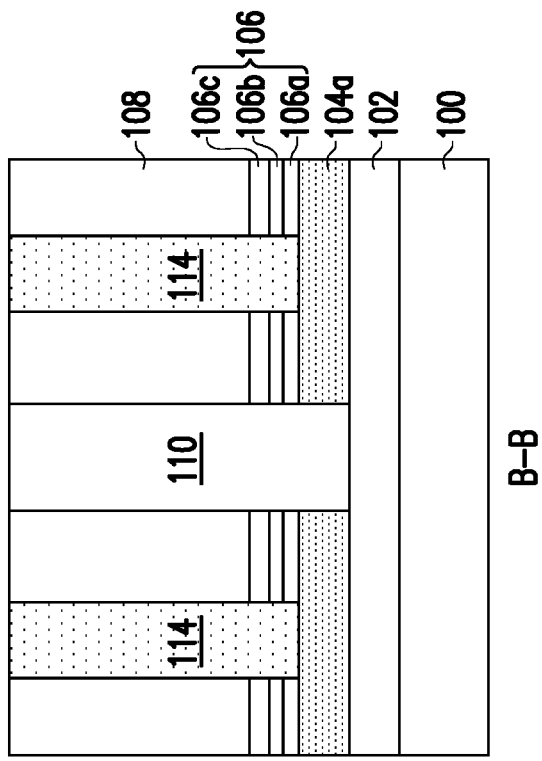
Figure 2D:
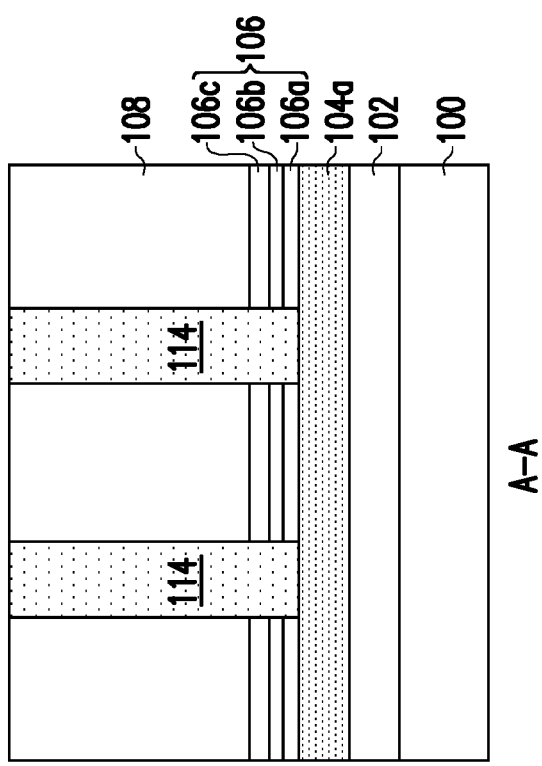
Figure 3E:
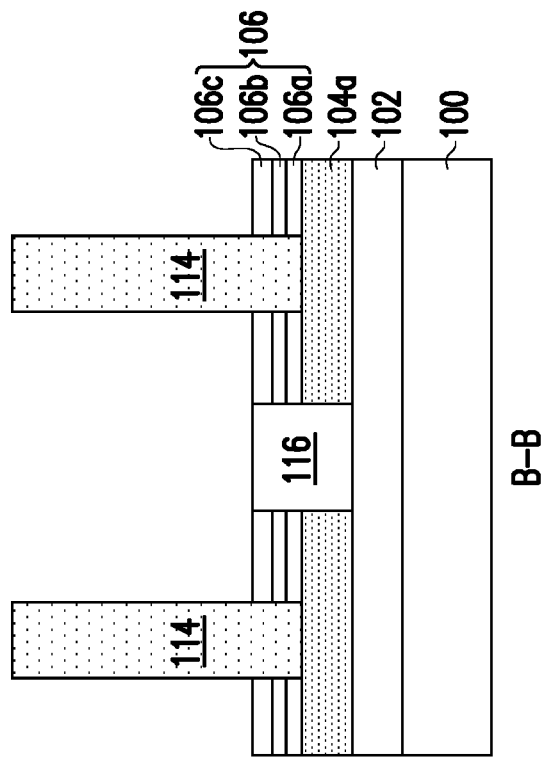
Figure 2E:
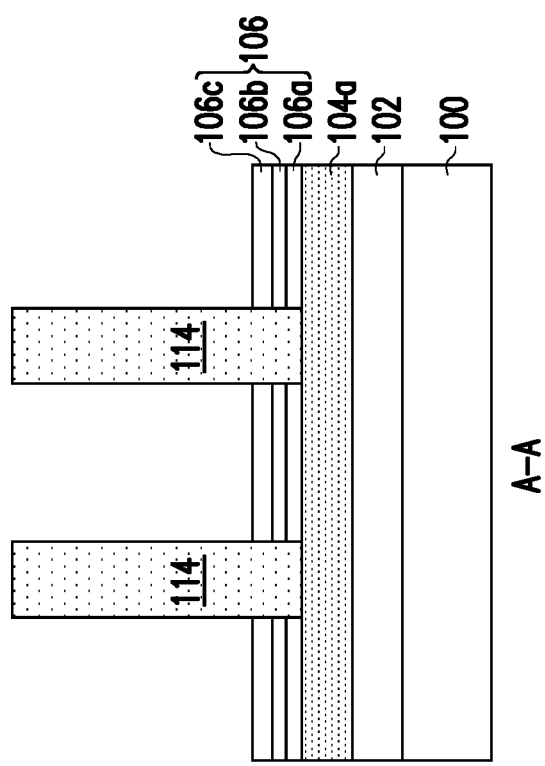

Referring to FIG. 2A to FIG. 2B and FIG. 3A to FIG. 3B, an isolation layer 110 is formed in the conductive layer 104, the buffer structure 106 and the dielectric layer 108. The isolation layer 110 extends along a direction of line A-A (i.e., the Y-direction in FIG. 1), thereby dividing the conductive layer 104 into a plurality of source lines 104a. The isolation layer 110 may be formed via a method of forming an opening 10 in the conductive layer 104, the buffer structure 106 and the dielectric layer 108. The opening 10 exposes a top surface of the bottom dielectric layer 102. Thereafter, an isolation material is filled into the opening 10 and a planarization process is carried out. In this stage, as shown in FIG. 3B, a top surface of the isolation layer 110 and a top surface of the dielectric layer 108 are substantially coplanar. In an embodiment, the planarization process may be a chemical mechanical polishing (CMP) process or an etching back process. The material of the isolation layer 110 may be a silicon oxide.

Referring to FIG. 2B to FIG. 2C and FIG. 3B to FIG. 3C, a plurality of openings 12 that penetrate through the buffer structure 106 and the dielectric layer 108 are formed, so as to expose a top surface of the source line 104a. In addition, since the openings 12 are configured to define a position of the bit line 114 in FIG. 1, the openings 12 are respectively formed on the source line 104a in array. Afterwards, a conductive material 112 is formed on the substrate 100. The conductive material 112 is filled in the opening 12 and covers the top surface of the dielectric layer 108. In an embodiment, the conductive material 112 may be, for example, a p-type polysilicon material, and the dopant implanted therein may be, for example, boron.

Referring to FIG. 2C to FIG. 2D and FIG. 2C to FIG. 3D, a planarization process is carried out so as to expose the top surface of the dielectric layer 108, and to form the bit lines 114 in each of the openings 12. In this stage, the top surface of the bit line 114 and the top surface of the dielectric layer 108 are substantially coplanar. In an embodiment, the planarization process may be a CMP process or an etching back process.

Referring to FIG. 2D to FIG. 2E and FIG. 3D to FIG. 3E, the isolation layer 110 is recessed, such that the top surface of the isolation structure 116 and the top surface of the buffer structure 106 are substantially coplanar. Thereafter, the dielectric layer 108 is removed so as to expose the top surface of the buffer structure 106. In an embodiment, the isolation layer 110 may be recessed via a wet etching process, which may be carried out by using an etching solution that has high etching selection ratio with respect to the isolation layer 110 and the dielectric layer 108 (or bit line 114). Similarly, the dielectric layer 108 may be removed via a wet etching method, which may be carried out by using an etching solution that has a high etching selection ratio with respect to the dielectric layer 108 and the bit line 114 (or isolation structure 116).

Figure 3F:
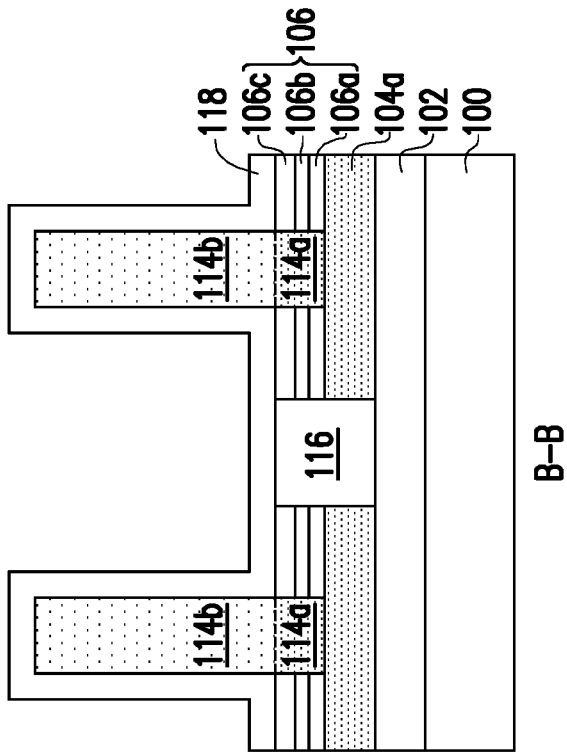
Figure 2F:
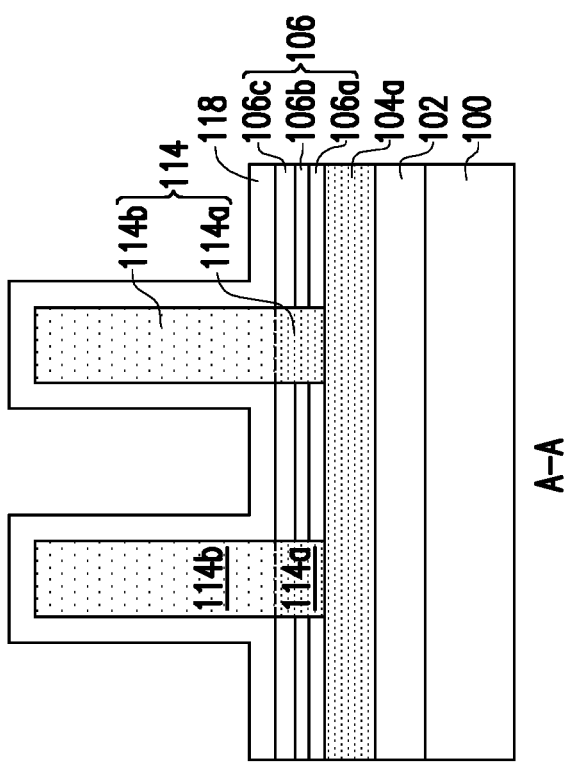

Referring to FIG. 2F and FIG. 3F, the charge storage structure 118 is formed on the substrate 100. The charge storage structure 118 conformally covers a surface of the bit line 114, the top surface of the buffer structure 106 and the top surface of the isolation structure 116. Although the charge storage structure 118 illustrated in FIG. 2F and FIG. 3F is a single-layered structure, in fact the charge storage structure 118 may include a tunneling dielectric layer, a charge storage layer and an electron blocking layer (not shown). The charge storage layer is disposed between the tunneling dielectric layer and the electron blocking layer. In an embodiment, the charge storage structure 118 may be, for example, a composite structure consisting of a silicon oxide layer/a silicon nitride layer/a silicon oxide layer, which should not be construed as a limitation to the invention. In other embodiment, the material of the charge storage layer may be a high dielectric constant material so as to provide high capacitive coupling. The high dielectric constant material refers to a dielectric material which has a dielectric constant higher than 4. The high dielectric constant material may be, for example, a silicon nitride, an aluminum oxide, a hafnium dioxide, a zirconium dioxide, a lanthanum oxide, an yttrium oxide or a combination thereof. As compared with a conventional memory which uses doped polysilicon as the floating gate, the charge storage structure 118 in the embodiment reduces the thickness of the tunneling dielectric layer and electron blocking layer while maintaining the reliability of the memory. In addition, the charge storage layer with high dielectric constant in the embodiment has a lower effective oxide thickness (EOT), which facilitates minimizing the size of memory. Additionally, since the high dielectric constant material is an electrical insulation material, electrons may be stored separately in the charge storage layer having high dielectric constant so as to achieve the effect of storing a data of four bits in a single memory cell. In an alternative embodiment, the material of the charge storage layer may be a material having a larger conduction band offset relative to the tunneling dielectric layer and the electron blocking layer and has a better reliability.

It should be mentioned that, under a high temperature condition, an n-type dopant of the source line 104a diffuses into a first portion 114a of the bit line 114 so as to form a source region. A second portion 114b of the bit line 114 is on the first portion 114a of the bit line 114. In an embodiment, the second portion 114b of the bit line 114 may be a p-type conductive type; the first portion (or source region) of the bit line 114 may be an n-type conductive type. The first portion 114a of the bit line 114 is embedded in the buffer structure 106. The charge storage structure 118 covers and surrounds the second portion 114b of the bit line 114. To keep the illustration simple and clear, the first portion 114a is only illustrated in FIG. 2F and FIG. 3F without being illustrated in the following drawings.

Figure 3G:
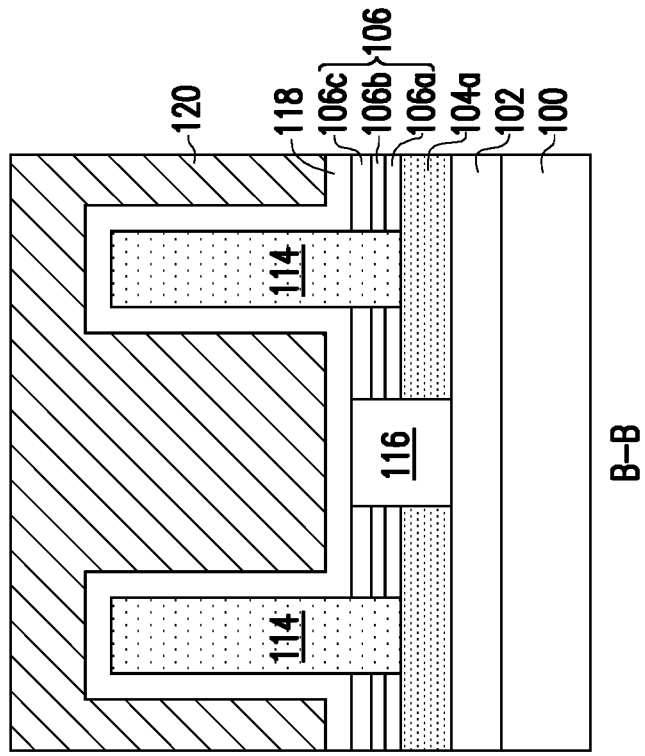
Figure 2G:
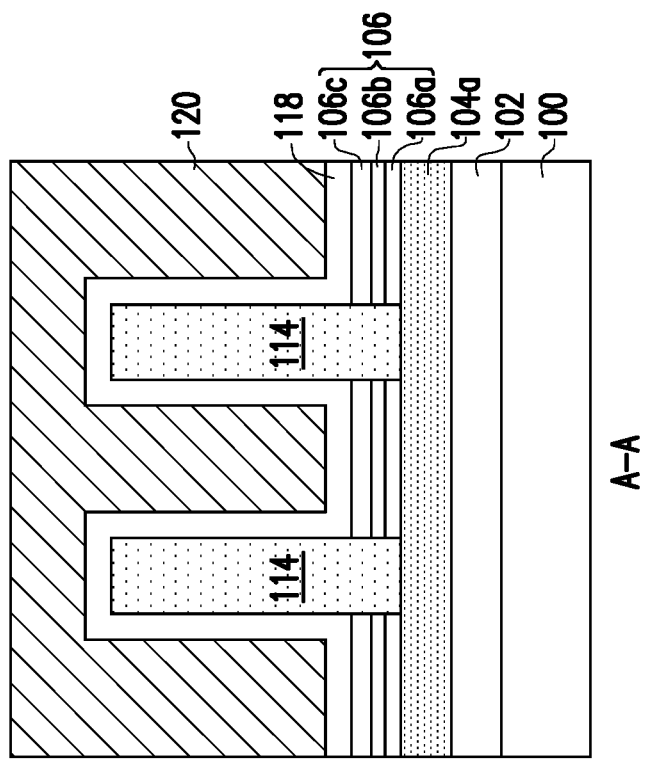

Referring to FIG. 2G and FIG. 3G, the conductive layer 120 is formed on the charge storage structure 118. The conductive layer 120 surrounds the charge storage structure 118 and covers the top surface of the charge storage structure 118. In an embodiment, the material of the conductive layer 120 may be a doped polysilicon, for example, and a forming method thereof may be a chemical vapor deposition process. In an alternative embodiment, the material of the conducive layer 120 may be a metallic material such as copper (Cu), aluminum (Al), tungsten (W) or a combination thereof.

Referring to FIG. 2G to FIG. 2H and FIG. 3G to FIG. 3H, a planarization process is conducted on the conductive layer 120 so as to expose the top surface of the charge storage structure 118. Under the circumstances, as shown in FIG. 2H and FIG. 3H, the conductive layer 120a is disposed aside the bit line 114, and the tops surface of the conductive layer 120a and the top surface of the charge storage structure 118 may be substantially coplanar. In an embodiment, the planarization process may be the CMP process or the etching back process.

Referring to FIG. 2H to FIG. 2I and FIG. 3H to FIG. 3I, an etching process is carried out to remove a portion of the conductive layer 120a so as to expose an upper portion 118U of the charge storage structure 118. Under the circumstances, as shown in FIG. 2I and FIG. 3I, the top surface of the conductive layer 120b is lower than the top surface of the charge storage structure 118 (or bit line 114). In an embodiment, the etching process may be the etching back process.

Figure 3N:
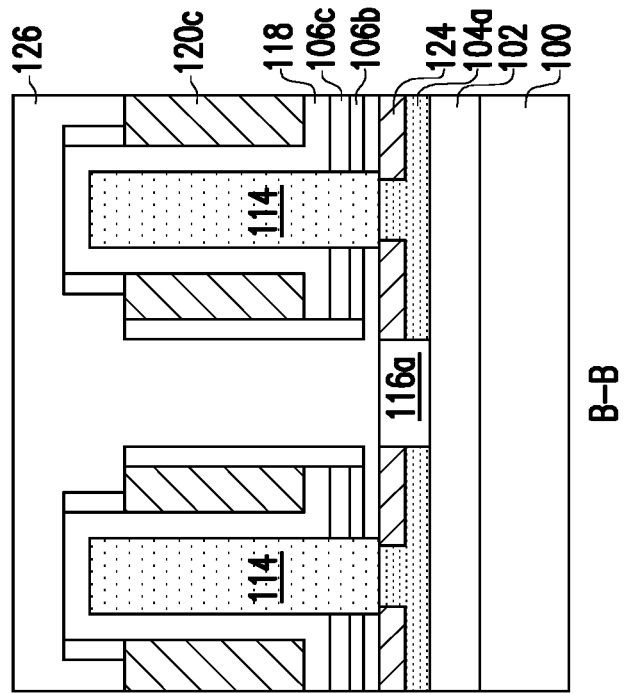
Figure 3O:
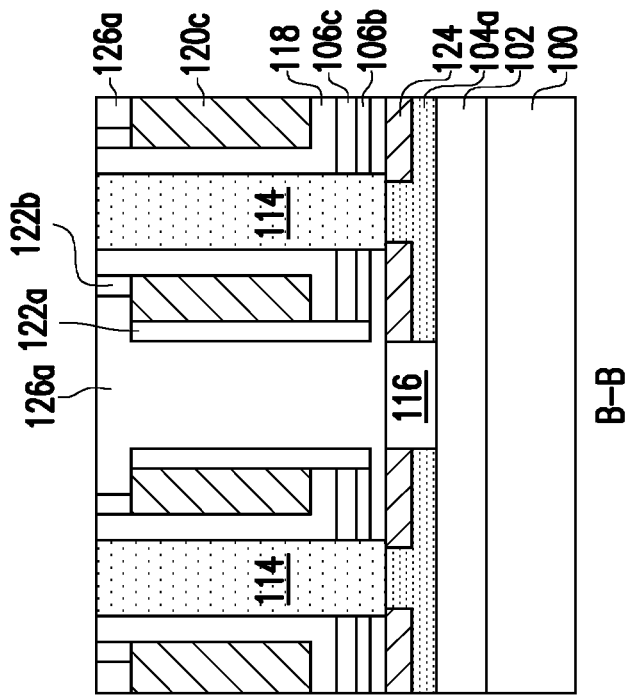
Figure 2K:
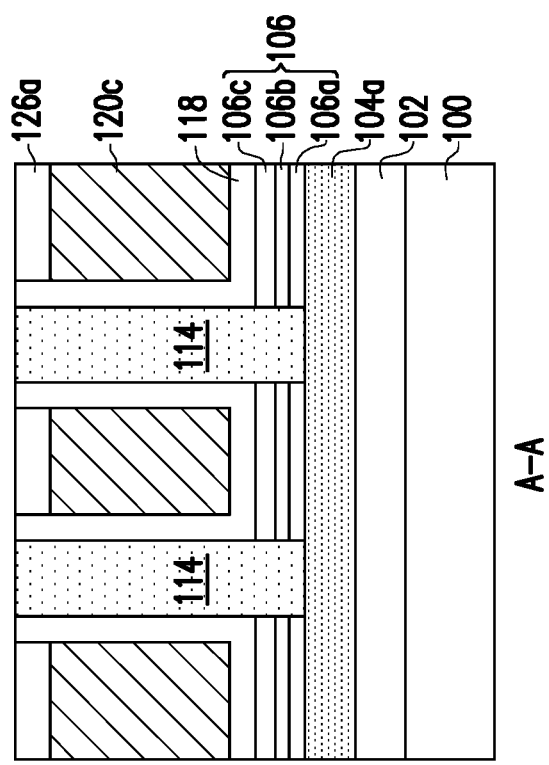
Figure 3P:
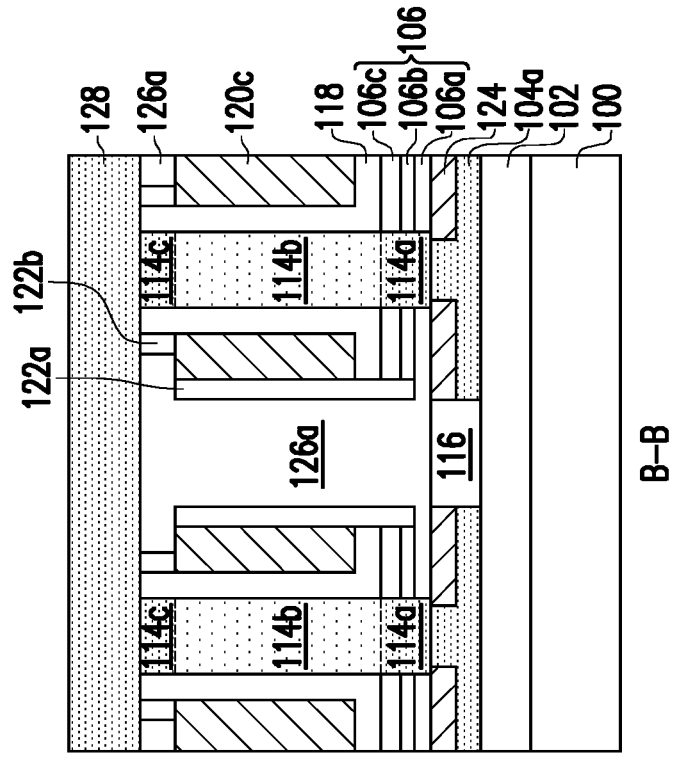
Figure 3K:
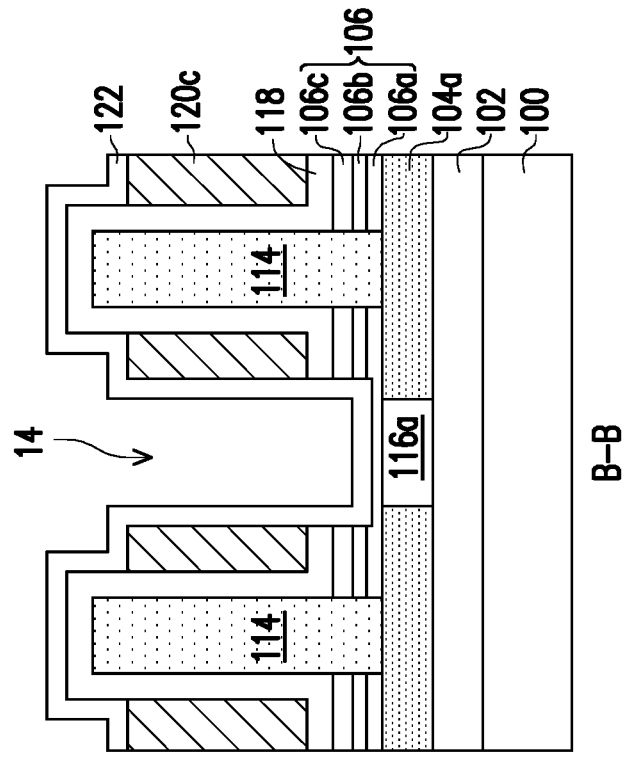
Figure 3J:
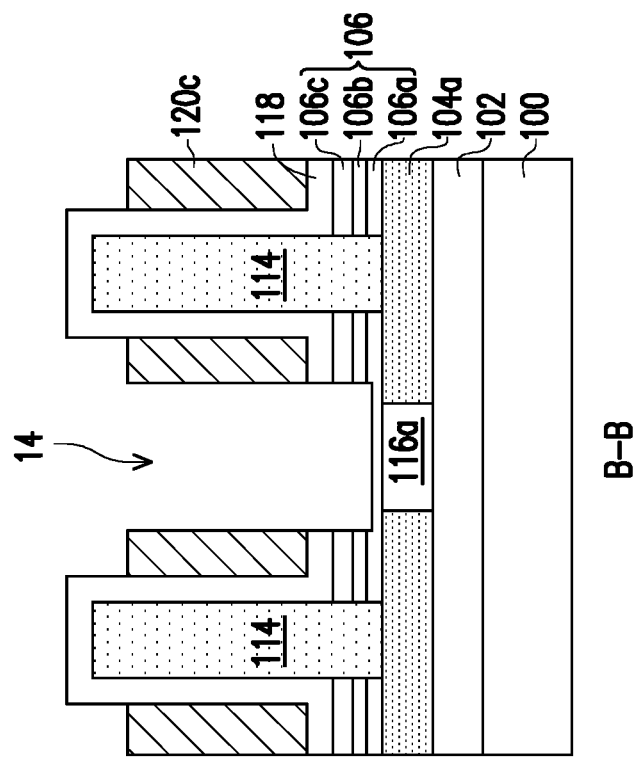

Referring to FIG. 3I and FIG. 3J, an opening 14 is formed in the conductive layer 120b between the bit lines 114 so as to form a conductive layer 120c. The opening 14 corresponds to the isolation structure 116a. In an embodiment, the opening 14 may be a strip-like opening which extends along the Y-direction (as shown in FIG. 1). The opening 14 penetrates through the conductive layer 120c, the charge storage structure 118 and a portion of the buffer structure 106 so as to expose the silicon oxide layer 106a of the buffer structure 106. In an embodiment, the forming method of the opening 14 includes a lithography process and an etching process. The etching process may be, for example, a reactive ion etching (RIE) process.

Referring to FIG. 3J and FIG. 3K, a spacer material 122 is formed on the substrate 100. The spacer material 122 conformally covers the surface of the opening 14, the top surface of the conductive layer 120c and the top surface of the charge storage structure 118. In an embodiment, the material of the spacer material 122 may be, silicon nitride, for example, and a forming method thereof may be a chemical vapor deposition process.

Figure 3M:
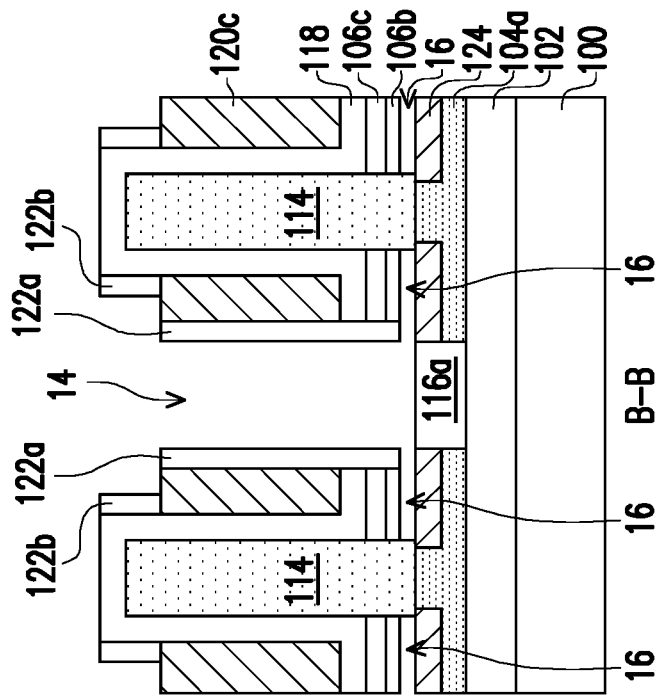
Figure 3L:
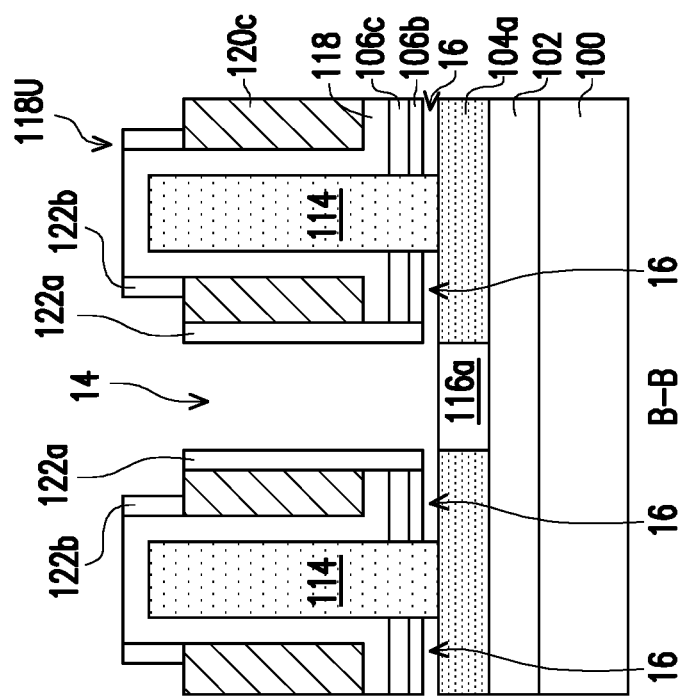

Referring to FIG. 3K and FIG. 3L, a dry etching process is carried out to remove a portion of the spacer material 122 so as to form a spacer 122a on the sidewall of the conductive layer 120c and form a spacer 122b on the sidewall of the upper portion 118U of the charge storage structure 118. Under such circumstances, the spacer material 122 at the bottom surface of the opening 14 is also removed so as to expose the top surface (not shown) of the silicon nitride layer 106a of the buffer structure 106. In an embodiment, the dry etching process may be, for example, an RIE process. Thereafter, a wet etching process is performed so as to remove the silicon oxide layer 106a of the buffer structure 106, and form a gap 16 in the buffer structure 106. The gap 16 exposes a portion of the top surface of the source line 104a. As shown in FIG. 3L, the gap 16 is defined by the silicon nitride layer 106b of the buffer structure 106, the bit line 114 and the source line 104a.

Referring to FIG. 3L and FIG. 3M, a metal silicide process is carried out so as to form a metal silicide layer 124 on a portion of the top surface of the source line 104a exposed from the gap 16. As shown in FIG. 3M, the metal silicide layer 124 is not only disposed on the top surface of the source line 104a that is not covered by the bit line 114, but also extends into the source line 104a under the bit line 114 so as to reduce the resistance between the source line 104a and the bit line 114, thereby improving the speed of memory. The metal silicide process includes forming a metal layer (not shown) on the source line 104a. Thereafter, an annealing process is carried out such that the metal layer is reacted with the source line 104a in contact to form the metal silicide layer 124. In an embodiment, the material of the metal silicide layer 124 is, for example, nickel silicide (NiSi), cobalt silicide (CoSi), titanium silicide (TiSi), tungsten silicide (WSi), molybdenum silicide (MoSi), platinum silicide (PtSi), palladium silicide (PdSi) or a combination thereof.

Figure 2J:
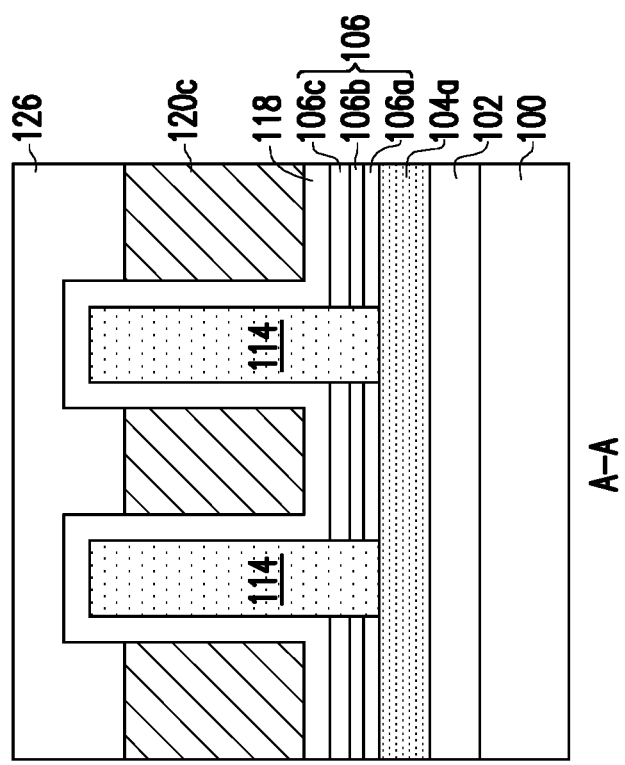
Figure 2L:
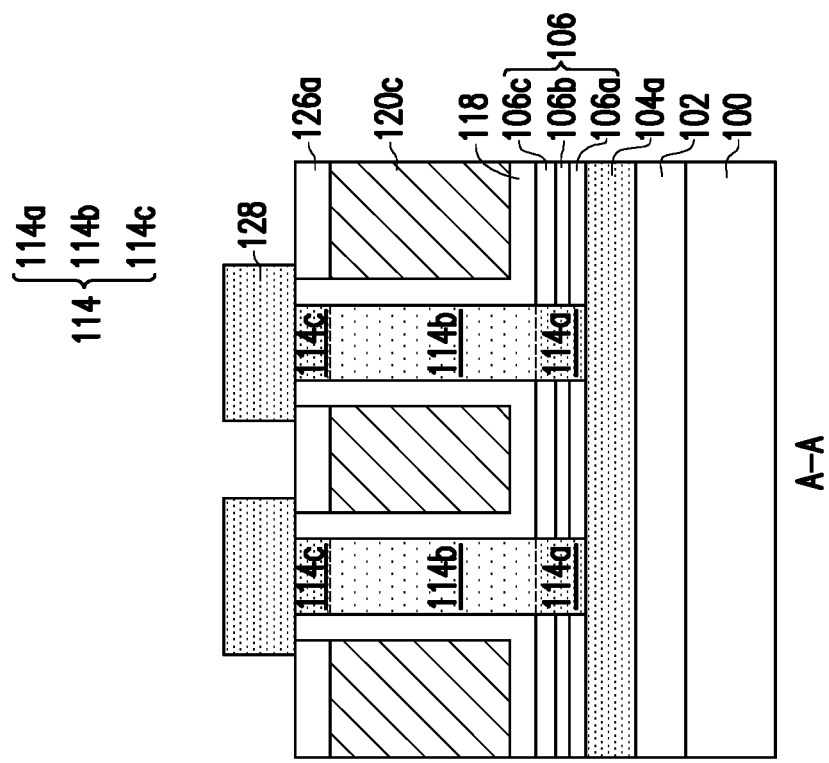

Since the change in the layers in FIG. 3J to FIG. 3M is not shown in the cross-sectional view taken along line A-A in FIG. 1, in order to keep the illustration simple and clear, the present invention does not show a cross-sectional view taken along line A-A corresponding to the steps illustrated in FIG. 3J to FIG. 3M. In other words, the step in FIG. 2J is carried out in continuation of the step of forming the metal silicide layer 124. Referring to FIG. 2J and FIG. 3M to FIG. 3N, the dielectric layer 126 is formed on the substrate 100. The dielectric layer 126 is filled into the opening 14 and filled into the gap 16. As shown in FIG. 3N, the dielectric layer 126 further covers the top surface of the charge storage structure 118. In an embodiment, the material of the dielectric layer 126 includes silicon oxide and the forming method thereof may be the chemical vapor deposition process.

Referring to FIG. 2J to FIG. 2K and FIG. 3N to FIG. 3O, a planarization process is carried out on the dielectric layer 126 to remove a portion of the dielectric layer 126, a portion of the charge storage structure 118 and a portion of the spacer 122b so as to expose the top surface of the bit line 114. Under such circumstances, as shown in FIG. 3O, the top surface of the bit line 114, the top surface of the charge storage structure 118 and the top surface of the dielectric layer 126a may be substantially coplanar. In an embodiment, the planarization process may be the CMP process or the etching back process.

Referring to FIG. 2L and FIG. 3P, the drain line 128 is formed on the bit line 114. The drain line 128 extends along a direction of line B-B (or the X direction in FIG. 1) across the source line 104a and the isolation structure 116a. In the embodiment, the drain line 128 may be an n+polysilicon layer, and the dopant implanted therein may be phosphor or arsenic, and the doping concentration thereof may be, for example, $1\times10^{18}/cm^3$ to $1\times10^{21}/cm^3$, which should not be construed as a limitation to the invention. In other embodiment, the drain line 128 may be a metal or other conductive material. In an alternative embodiment, an ion implantation process may be performed on the bit line 114 so as to implant the phosphor dopant or arsenic dopant into the third portion 114c of the bit line 114, thereby forming the drain region. In other words, as shown in FIG. 2L, the bit line 114 includes the first portion 114a, the second portion 114b and the third portion 114c. The second portion 114b is between the first portion 114a and the third portion 114c. In an embodiment, the conductive type of the second portion 114b is different from the conducive type of the first portion 114a and the third portion 114c. In the embodiment, the second portion 114b may have a p-type conductive type, which may be regarded as an active region or a channel region. The first portion 114a and the third portion 114c may have an n-type conductive type. The first portion 114a may be regarded as a source region; the third portion 114c may be regarded as a drain region.

It should be pointed out that, as shown in FIG. 2L and FIG. 3P, the bit line 114 extends from the source line 104a to the drain line 128. The charge storage structure 118 surrounds the sidewall of the bit line 114 and extends to cover the top surface of the buffer structure 106. The conductive layer 120c covers the surface of the charge storage structure 118 such that the charge storage structure 118 is disposed between the bit line 114 and the conductive layer 120c. The conductive layer 120c at least covers the second portion (or channel region) 114b of the bit line 114. That is to say, the conductive layer 120c may be regarded as a control gate or a word line of the memory cell.

In the embodiment, although the source line 104a illustrated in FIG. 2L and FIG. 3P is a source end, and drain line 128 is a drain end, which should not be construed as a limitation to the invention. In other embodiments, the source line 104a may serve as a drain end, and the drain line 128 may serve as a source end.

Figure 4B:
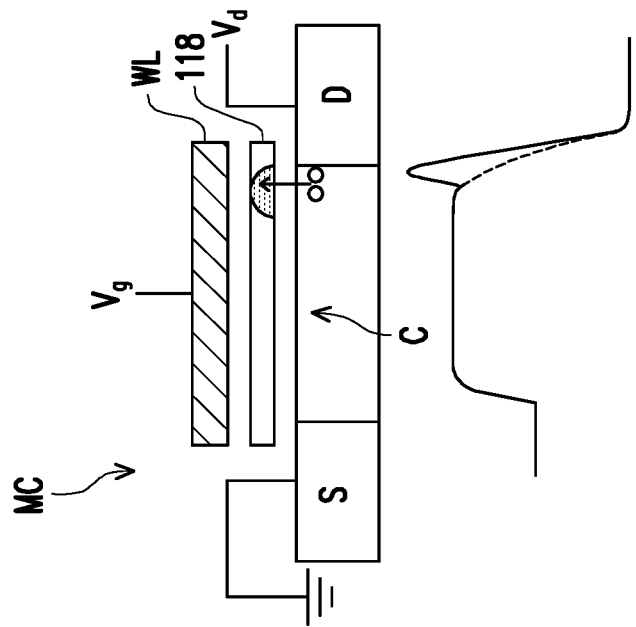
FIG. 4B is a cross-sectional schematic view illustrating an operation of erasing a three-dimensional memory in an embodiment of the invention.
Figure 4A:
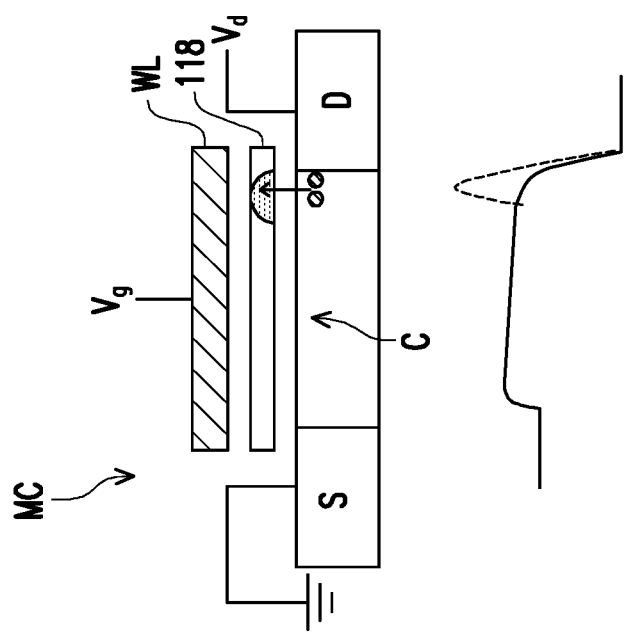
FIG. 4A is a cross-sectional schematic view illustrating an operation of programming a three dimensional memory in an embodiment of the invention.
Figure 4C:
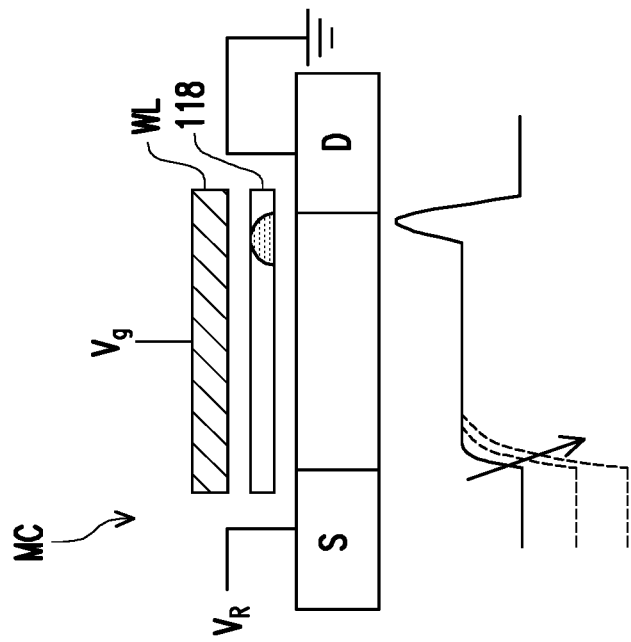
FIG. 4C and FIG. 4D are cross-sectional schematic views respectively illustrating an operation of reading a three dimensional memory in an embodiment of the invention.
Figure 4D:
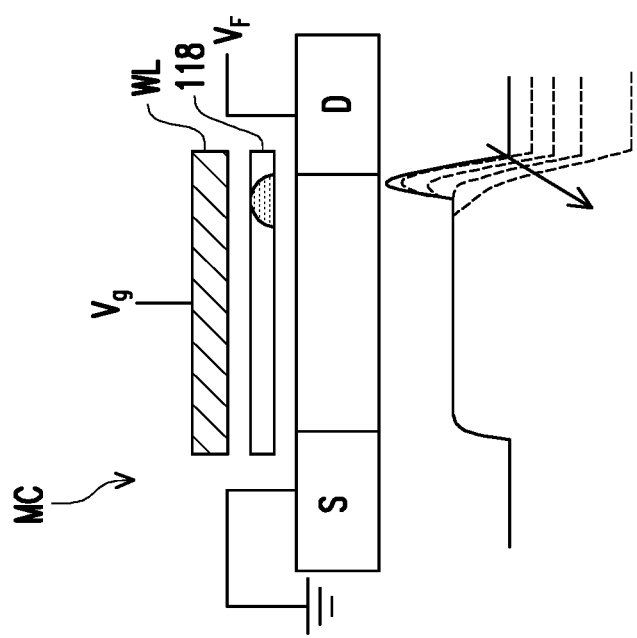

FIG. 4A is a cross-sectional schematic view illustrating an operation of programming a three dimensional memory of an embodiment of the invention. FIG. 4B is a cross-sectional schematic view illustrating an operation of erasing a three dimensional memory of an embodiment of the invention. FIG. 4C and FIG. 4D are cross-sectional schematic views respectively illustrating an operation of reading a three dimensional memory of an embodiment of the invention.

An operating method of the three dimensional memory of the embodiment includes programming, erasing or reading the charge storage structure 118 in FIG. 1. Referring to FIG. 4A, a mechanism of programming the charge storage structure 118 includes a channel hot electron injection mode. Specifically, the channel hot electron injection mode involves steps as follows. A positive voltage $V_g$ is applied to the word line WL (which corresponds to the conductive layer 120c in FIG. 1), another positive voltage $V_d$ is applied to the drain D (which corresponds to the drain line 128 in FIG. 1), and a source S (which corresponds to the source line 104a in FIG. 1) is grounded so as to conduct the memory cell. Accordingly, a current flows into the source S from the drain D, and the hot electron generated in the channel C is attracted and stored in the charge storage structure 118 near the drain D so as to generate a "01" state. Similarly, different voltages are applied to the word line WL, the drain D and the source S so as to generate "10", "11" or "00" states respectively. Accordingly, the charge storage structure 118 in the embodiment may be configured to store data of four bits. In an embodiment, the voltage $V_g$ may range from 7 volts to 9.5 volts; the voltage $V_d$ may range from 3.5 volts to 5 volts.

Referring to FIG. 4B, a mechanism for erasing the charge storage structure 118 includes a band to band hot hole injection mode. Specifically, the band to band hot hole injection mode involves steps as follows. A negative voltage $V_g$ is applied to the word line WL (which corresponds to the conductive layer 120c in FIG. 1), the positive voltage $V_d$ is applied to the drain D (which corresponds to the drain line 128 in FIG. 1), and the source S (which corresponds to the source line 104a in FIG. 1) is grounded. In this manner, the hot hole in the channel C is attracted and injected into the charge storage structure 118 near the drain D, such that the hot hole is coupled to the electron stored therein. In the embodiment, the band to band hot hole injection mode is applied to erase the charge storage structure 118, which can reduce the damage caused to the tunneling dielectric layer in the charge storage structure 118, thereby improving the reliability of the three dimensional memory. In an embodiment, the voltage $V_g$ may range from −10 volts to −15 volts; the voltage $V_d$ may range from 3.5 volts to 5 volts.

Referring to FIG. 4C and FIG. 4D, a mechanism for reading the charge storage structure 118 includes a forward read mode and a reverse read mode. Specifically, the forward read mode involve steps as follows. As shown in FIG. 4C, a reading voltage $V_g$ is applied to the word line WL (which corresponds to the conducive layer 120c in FIG. 1), a forward voltage $V_f$ is applied to the drain D (which corresponds to the drain line 128 in FIG. 1), and the source S (which corresponds to the source line 104a in FIG. 1) is grounded so as to read the storage state of the charge storage structure 118 near the drain D. Therefore, when the electron is stored in the charge storage structure 118 near the drain D, the threshold of the memory cell is increased, and the memory cell performs operation in an OFF state. In an embodiment, the reading voltage $V_g$ may range from 3.5 volts to 4.5 volts; the voltage $V_f$ may range from 0.7 volt to 1.2 volts.

The reverse read mode involve steps similar to the steps described above. As shown in FIG. 4D, the reading voltage is applied to the word line WL (which corresponds to the conductive layer 120c in FIG. 1), a positive voltage $V_R$ is applied to the source S (which corresponds to the source line 104a in FIG. 1), and the drain D (which corresponds to the drain line 128 in FIG. 1) is grounded so as to read the storage state of the charge storage structure 118 near the source S. Therefore, when the electron is not stored in the charge storage structure 118 near the source S, the threshold of the memory cell is reduced, and the memory cell performs operation in an ON state. In an embodiment, the reading voltage $V_g$ may range from 3.5 volts to 4.5 volts; the voltage $V_R$ may range from 0.7 volt to 1.2 volts.

In summary, according to the invention, the isolation structure is disposed between two adjacent source lines so as to electrically isolate the two adjacent source lines, thereby reducing the interference during reading operation. On the other and, the invention uses the high dielectric constant material as the charge storage layer, which can store data of four bits in a single memory cell, thereby improving the overall storage capability of the three dimensional memory. In addition, according to the invention, the memory cell is erased via the band to band hot hole injection mode, which can reduce damage caused to the tunneling dielectric layer, thereby improving the reliability of the three dimensional memory.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A three dimensional NOR flash memory, comprising:
   a plurality of source lines, disposed on a substrate;
   a plurality of isolation structures, respectively disposed between the source lines so as to electrically isolate the source lines;
   a plurality of drain lines, disposed on the source line, wherein extension directions of the drain line and the source line are different;
   a plurality of bit lines, each having two ends respectively connected with the source line and the drain line;
   a plurality of charge storage structures, respectively surrounding the plurality of bit lines; and
   a plurality of conductive layers, respectively covering surfaces of the charge storage structures arranged along each of the source lines,
   wherein each of the plurality of drain lines connects to corresponding ones of the plurality of bit lines.

2. The three dimensional NOR flash memory according to claim 1, wherein a material of the bit line comprises a first type polysilicon material, a material of the source line and the drain line comprises a second type polysilicon material, and the first type polysilicon material is different from the second type polysilicon material.

3. The three dimensional NOR flash memory according to claim 1, wherein each of the bit lines comprises a first portion not surrounded by the charge storage structure, a second portion surrounded by the charge storage structure, and a third portion not surrounded by the charge storage structure, the second portion is disposed between the first portion and the third portion, the first portion is connected to the source line and serves as a source, the third portion is connected to the drain line and serves as a drain.

4. The three dimensional NOR flash memory according to claim 1, further comprising a metal silicide layer disposed on the source line so as to reduce a resistance between the source line and the bit line.

5. The three dimensional NOR flash memory according to claim 1, wherein the charge storage structure is configured to store a data of four bits.

6. The three dimensional NOR flash memory according to claim 1, wherein the charge storage structure comprises a tunneling dielectric layer, a charge storage layer and an electron blocking layer, the charge storage layer is disposed between the tunneling dielectric layer and the electron blocking layer.

7. The three dimensional NOR flash memory according to claim 6, wherein a material of the charge storage layer comprises a silicon nitride, an aluminum oxide, a hafnium dioxide, a zirconium dioxide, a lanthanum oxide, an yttrium oxide or a combination thereof.

8. An operating method of the three dimensional NOR flash memory according to claim 1, comprising programming, erasing or reading the charge storage structure.

9. The operating method of the three dimensional NOR flash memory according to claim 8, wherein the step of programming the charge storage structure comprises applying a positive voltage to the conductive layer, applying another positive voltage to the drain line and grounding the source line so as to store an electron in the charge storage structure near the drain line.

10. The operating method of the three dimensional NOR flash memory according to claim 8, wherein the step of erasing the charge storage structure comprises applying a negative voltage to the conductive layer, applying a positive voltage to the drain line and grounding the source line so as to attract a hole into the charge storage structure near the drain line.

11. The operating method of the three dimensional NOR flash memory according to claim 8, wherein the step of reading the charge storage structure comprises applying a reading voltage to the conductive layer, applying a positive voltage to the drain line and grounding the source line so as to read a storage state of the charge storage structure near the drain line.

12. The operating method of the three dimensional NOR flash memory according to claim 8, wherein the step of reading the charge storage structure comprises applying a reading voltage to the conductive layer, applying a positive voltage to the source line and grounding the drain line so as to read a storage state of the charge storage structure near the source line.

* * * * *